United States Patent [19]
Knopf

[11] Patent Number: 5,585,675
[45] Date of Patent: Dec. 17, 1996

[54] SEMICONDUCTOR DIE PACKAGING TUB HAVING ANGULARLY OFFSET PAD-TO-PAD VIA STRUCTURE CONFIGURED TO ALLOW THREE-DIMENSIONAL STACKING AND ELECTRICAL INTERCONNECTIONS AMONG MULTIPLE IDENTICAL TUBS

[75] Inventor: George S. Knopf, Palm Bay, Fla.

[73] Assignee: Harris Corporation, Melbourne, Fla.

[21] Appl. No.: 241,110

[22] Filed: May 11, 1994

[51] Int. Cl.$^6$ .................. H01L 23/02; H01L 23/34; H01L 23/48
[52] U.S. Cl. .................. 257/774; 257/686; 257/723; 257/777
[58] Field of Search .................. 257/666, 678, 257/685, 686, 723, 773, 774, 777

[56] References Cited

U.S. PATENT DOCUMENTS

| | | | |
|---|---|---|---|
| 4,525,921 | 7/1985 | Carson | 29/577 |
| 4,734,825 | 3/1988 | Peterson | 361/414 |
| 4,862,249 | 8/1989 | Carlson | 357/80 |
| 5,434,452 | 7/1995 | Higgins, III | 257/773 |

*Primary Examiner*—Sara W. Crane
*Assistant Examiner*—Carl Whitehead, Jr.
*Attorney, Agent, or Firm*—Charles E. Wands

[57] ABSTRACT

A packaging assembly for a plurality of semiconductor circuit chips is comprised of a plurality of stacked tub-configured structures, each tub-configured structure including a floor portion sized to receive and mount thereon a respective semiconductor chip, and a surrounding wall portion having a top surface upon which a first arrangement of tub-to-tub bonding pads is formed and a bottom surface upon which a second arrangement of tub-to-tub bonding pads is formed. The first and second arrangements of tub-to-tub bonding pads are mutually aligned with one another along normals to the top and bottom surfaces of a tub, and an interconnect lead network connects a terminal pad of a respective chip with a respective bonding tub-to-tub bonding pad. Each tub-configured chip mounting architecture has an identically configured pad extension layer associated with the same prescribed bonding pad. Conductive pad-to-pad vias extend through the surrounding wall portion between respective ones of the first and second arrangements of tub-to-tub bonding pads at an angle offset from normals to the top and bottom surfaces of the tub. As a result, angularly offset via paths are provided through the stacked tub-configured structures.

22 Claims, 5 Drawing Sheets

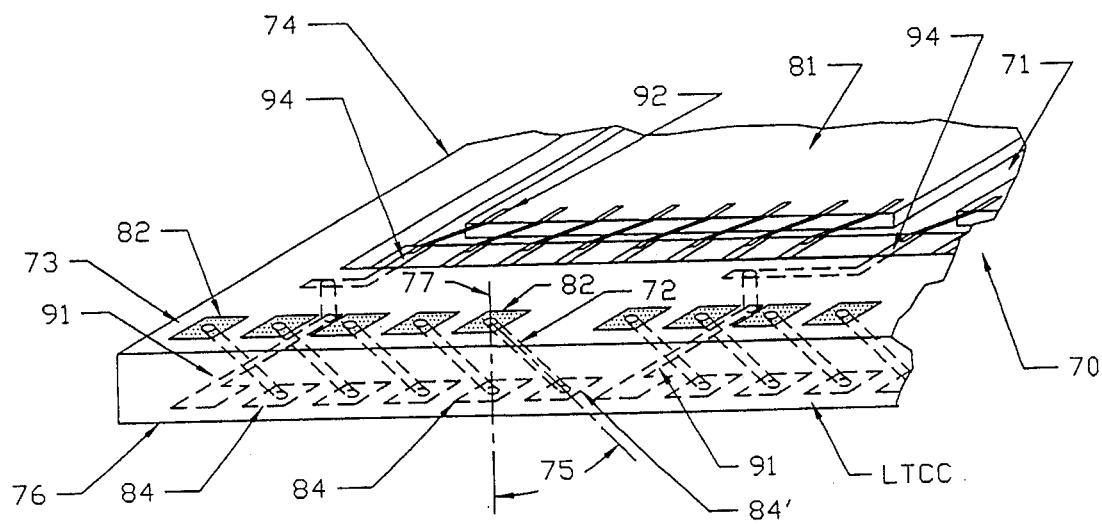
FIG 3
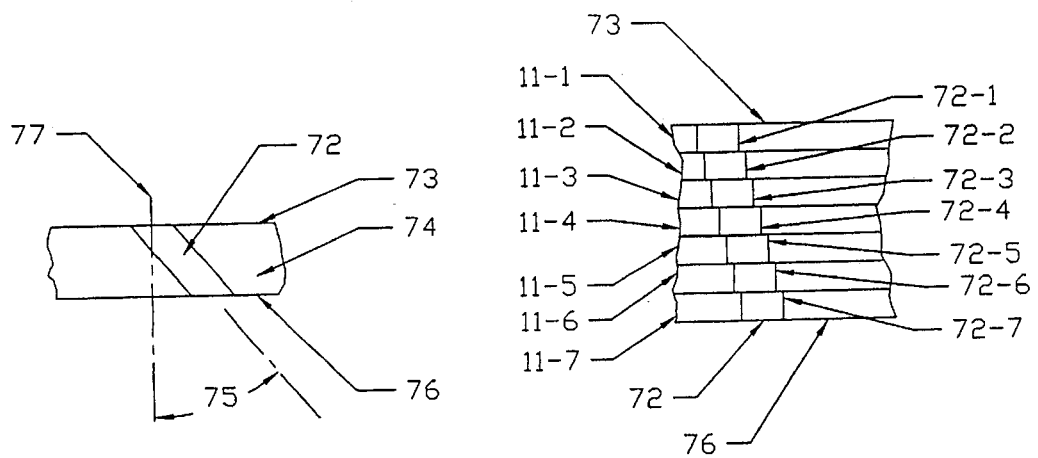
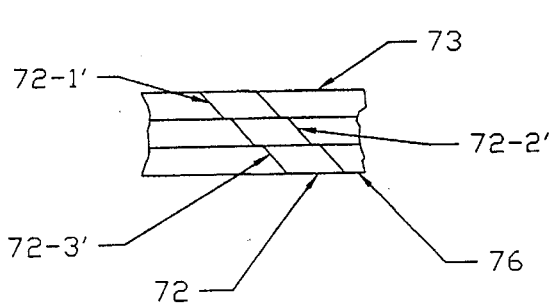
FIG 6    FIG 7
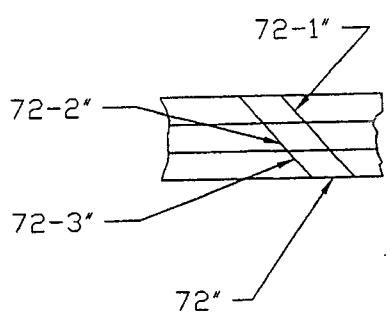
FIG 8    FIG 9

SEMICONDUCTOR DIE PACKAGING TUB HAVING ANGULARLY OFFSET PAD-TO-PAD VIA STRUCTURE CONFIGURED TO ALLOW THREE-DIMENSIONAL STACKING AND ELECTRICAL INTERCONNECTIONS AMONG MULTIPLE IDENTICAL TUBS

FIELD OF THE INVENTION

The present invention relates in general to integrated circuit chip packaging assemblies, and is particularly directed to a new and improved stackable 'tub'-configured packaging architecture that contains a peripherally distributed arrangement of topside, or upper surface-distributed, and bottomside, or lower surface-distributed, interconnect pads, associated interconnect vias between which provide an angularly offset spatial translation of the direction of interconnect between surfaces, so that, as one proceeds through a stack of such tubs, the interconnect path is effectively angularly stepped between tubs, thereby allowing each tub to be identically configured.

BACKGROUND OF THE INVENTION

Among the requirements of variety of microelectronic circuit components and systems is the need for the circuit-containing modules to have a high packing density (minimum volume). For this purpose, the integrated circuit chip packaging industry has developed a number of multi-chip assembly architectures through which a plurality of leadless chip carriers (LCCs) or a plurality of semiconductor (silicon) dies may be mounted in a 'stacked' configuration on a printed wiring board and interconnected by means of pad-to-pad bonds between die-containing elements.

An example of such a stacked packaging assembly is diagrammatically illustrated in FIG. 1, which shows a plurality of (e.g. six) chip-carrying 'tubs' 11-1 . . . 11-6 having upper or topside surfaces 13-1 . . . 13-6 and lower or bottomside surfaces 15-1 . . . 15-6, respectively, around the periphery of which respective pluralities of bonding pads 21-1 . . . 21-6 and 23-1 . . . 23-6 are distributed. A respective tub may be formed of a lamination of multiple, very thin layers of low temperature co-fired ceramic (LTCC) material, which are capable of being hermetically sealed.

An individual tub 11 has a floor portion 12 upon which a semiconductor circuit chip (die) 31 is mounted, and a surrounding wall portion 14, which is adjacent to and defines the perimeter of the floor portion. The floor portion of the tub may be formed of a bottom one of the laminate of LTCC layers, the bottom surface of which forms the bottom surface of the tub 11, proper. A generally centrally located region 32 of the top surface of the adjacent floor layer forms the mounting surface for a semiconductor circuit chip 31. As a non-limiting example, the die may be mechanically secured to the top surface of the floor portion by means of non-organic silver/glass die attachment material.

The terminal pads of a respective die 31 are typically distributed around the periphery of its top surface for connection through a lead distribution network to bonding pads 21 and 23 through which external access to the chip is provided. The bond pads 21 on the upper surface 13 of the surrounding wall portion of a respective tub 11 are customarily spatially vertically aligned with the bonding pads 23 on the lower surface 15 of that tub, and conductively filled or plated through vias 25 are formed in the tub, so as to provide a top-to-bottom interconnect path for each tub.

In order to connect one or more pads to the circuitry of a respective semiconductor die or chip 31, that is disposed on floor portion 12 of the interior of a tub 11, the layer of metal of which the (upper) bonding pads 21 are formed may be patterned to provide a pad extension layer, such as that shown at 41. The geometry of the pad extension layer 41 is configured to allow a relatively linear connection of a chip interconnect lead 43, from a lip or edge portion 45 of one of the layers of the laminate structure of the tub to a via 51 that is vertically aligned with a portion of the pad extension layer 41. Connections to the circuitry of the chip proper are provided by respective leads 53 that join interconnect leads 43 to contact regions 55 on the chip.

As one proceeds through the stack of tubs, a respectively different one of the upper bonding pads 21 has an associated pad extension layer 41, so as to allow a different one of chip connection leads 53 to be joined to a respectively different upper pad 21. Since the upper pads are spatially aligned with the lower pads 23, then, as diagrammatically illustrated in FIG. 2, with the tubs stacked together and pad-to-pad bonds provided between opposing tubs, it can be seen that a plurality of vertical interconnect paths 61-1 . . . 61-6 are provided through successively interconnected through vias 25 of the stack of tubs, thereby providing external electrical access, via pads 23 of the lowermost tub 11-1, to each of the chips mounted within the stack of tubs.

Now, although the tub architecture and associated bonding pad sites of the conventional stacked packaging assembly of FIGS. 1 and 2 allows a plurality of leadless chip carriers or tub-housed semiconductor dies to be arranged in a 'stacked' configuration on a printed wiring board and interconnected by means of pad-to-pad bonds between tubs, each tub in the stack must employ a respectively different pad extension layer pattern. As a consequence, as the number of tubs in the stack increases there is an associated need for an increased number of different tub designs, which not only increases cost of manufacture, but makes the yield of the overall multi-tub packaging assembly dependent upon the yield of its lowest yield tub. Moreover, because each tub is unique, the tubs are not interchangeable.

SUMMARY OF THE INVENTION

In accordance with the present invention, the above-described shortcomings of a conventional tub architecture having respectively different interconnect patterns for each tub in a stack assembly to accommodate pad-to-pad bonding of mutually aligned conductive vias are effectively obviated by means of a new and improved tub architecture, that allows a single type of tub architecture to be employed for each tub in a multi-stack assembly, thereby providing both interchangability and reducing costs of tub manufacture, while still providing for pad-to-pad bonding between successive tubs in a stack, so that external electrical access to each of the chips mounted within the stack of tubs may provided via pads of the bottom tub of the stack.

More particularly, rather than uniquely tailor the geometry of the interconnect pattern (the pad extension shown at 41 in FIG. 1) on a pad surface of each tub, in dependence upon its intended location in the stack, and thereby displace the pad extension layer to provide for direct via interconnect routing through the stack, as diagrammatically illustrated in FIG. 2, referenced above, the present invention modifies the geometry of the internal vias through the tub, so that an upper bonding pad is interconnected, not to a corresponding lower bonding pad directly beneath it (i.e. vertically aligned with the upper pad), but rather to another lower bonding pad that is displaced from (e.g. adjacent to) such (vertically) aligned lower bonding pad.

For this purpose, the internal geometry of a via may be such that the via effectively passes through the thickness of the tub at an angular offset relative to a normal to the top or bottom surface of the tub, with the arrangement of bonding pads on the top surface of the tub be vertically aligned (parallel to the normal) with the arrangement of bonding pads on the bottom surface of the tub. In a preferred embodiment of the present invention, for practical and efficient use of pad resources, this angular offset of a via is such that the via connects an upper bonding pad to a lower bonding pad that is immediately adjacent to a lower bonding pad that is vertically aligned with the upper pad. In addition, unlike the conventional tub architecture, since each tub is configured the same, a pad extension layer is associated with the same upper bonding pad. However, due to the angular offset of the vias through the tub, then, when the tubs are arranged in a stack and opposing bonding pads of spatially aligned arrangements of bonding pads on upper and lower surfaces of adjacent tubs are joined together, each pad extension layer will be interconnected through successively offset pads through the stack to a respectively different bonding pad at the lower surface of the bottom tub of the stack, and thereby provide the intended external electrical access, via pads of the bottom tub, to each of the chips mounted within the stack of tubs.

DETAILED DESCRIPTION OF THE DRAWINGS

FIG. 1 diagrammatically illustrates an example of a conventional stacked chip packaging assembly, having a plurality of tubs around the periphery of each of which respective a plurality of bonding pads is formed;

FIG. 2 diagrammatically illustrates a plurality of vertical interconnect paths through a plurality of the tubs of FIG. 1 stacked together with pad-to-pad bonds provided between opposing tubs;

FIG. 3 diagrammatically illustrates a tub architecture in accordance with an embodiment of the present invention;

FIG. 4 diagrammatically illustrates a stacked chip packaging assembly formed of a stack of plural ones of the tub architecture of FIG. 3;

FIG. 5 diagrammatically illustrates a plurality of vertical interconnect paths through the stacked of tub assembly of FIG. 4 with pad-to-pad bonds provided between opposing tubs;

FIG. 6 is a simplified side view of a tub formed of a single unitary body having vias bored at an acute angle offset from the normal to its upper and lower surfaces;

FIG. 7 is a simplified side view of a further embodiment of tub formed of a plurality of laminated layers, wherein the effective angular offset of the resulting via is achieved by laterally offsetting respective individual vias in each tub layer in a stepwise manner;

FIG. 8 is a simplified side view of a tub formed of a plurality of laminated layers, wherein the effective angular offset of the resulting via is achieved by laterally offsetting respective individual inclined vias in each tub layer in a stepwise manner; and FIG. 9 is a simplified side view of a tub formed of a plurality of laminated layers, wherein the angle of inclination and offset is such that the vias are sequentially aligned so that the resulting bore has a substantially continuous interior surface geometry from the top surface to the bottom surface of the laminate stack.

DETAILED DESCRIPTION

Figure 1:
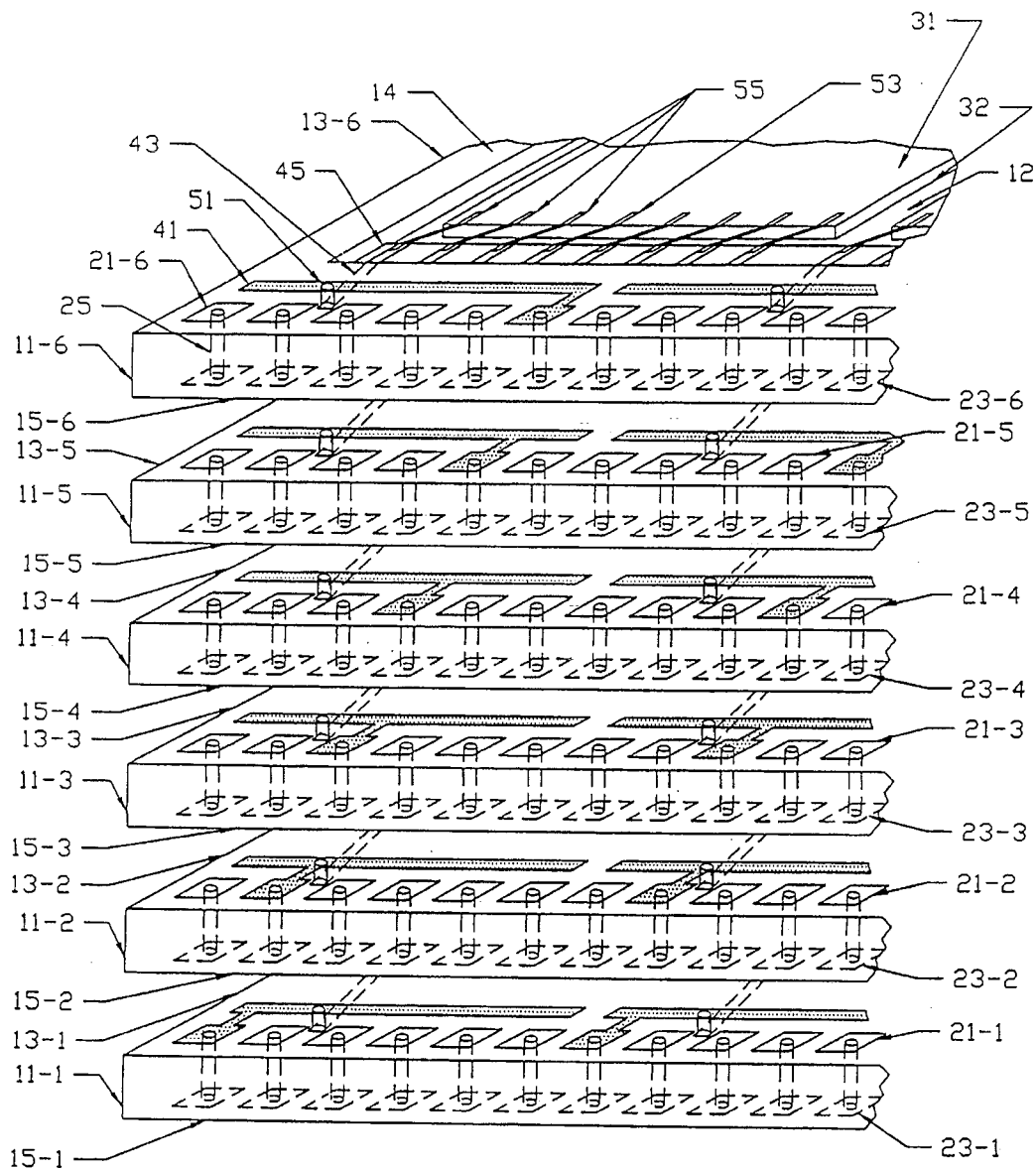
Figure 2:
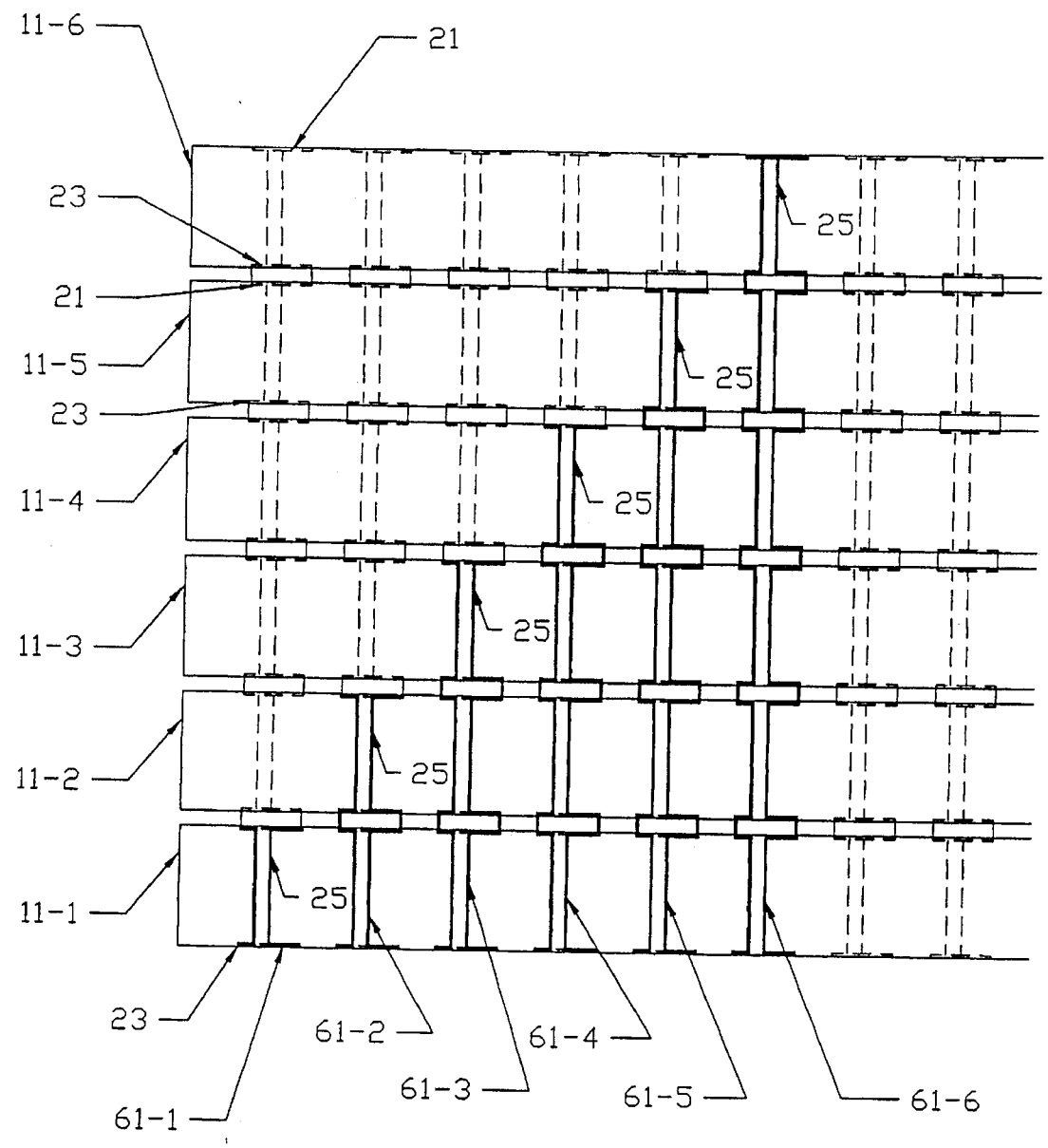
Figure 4:
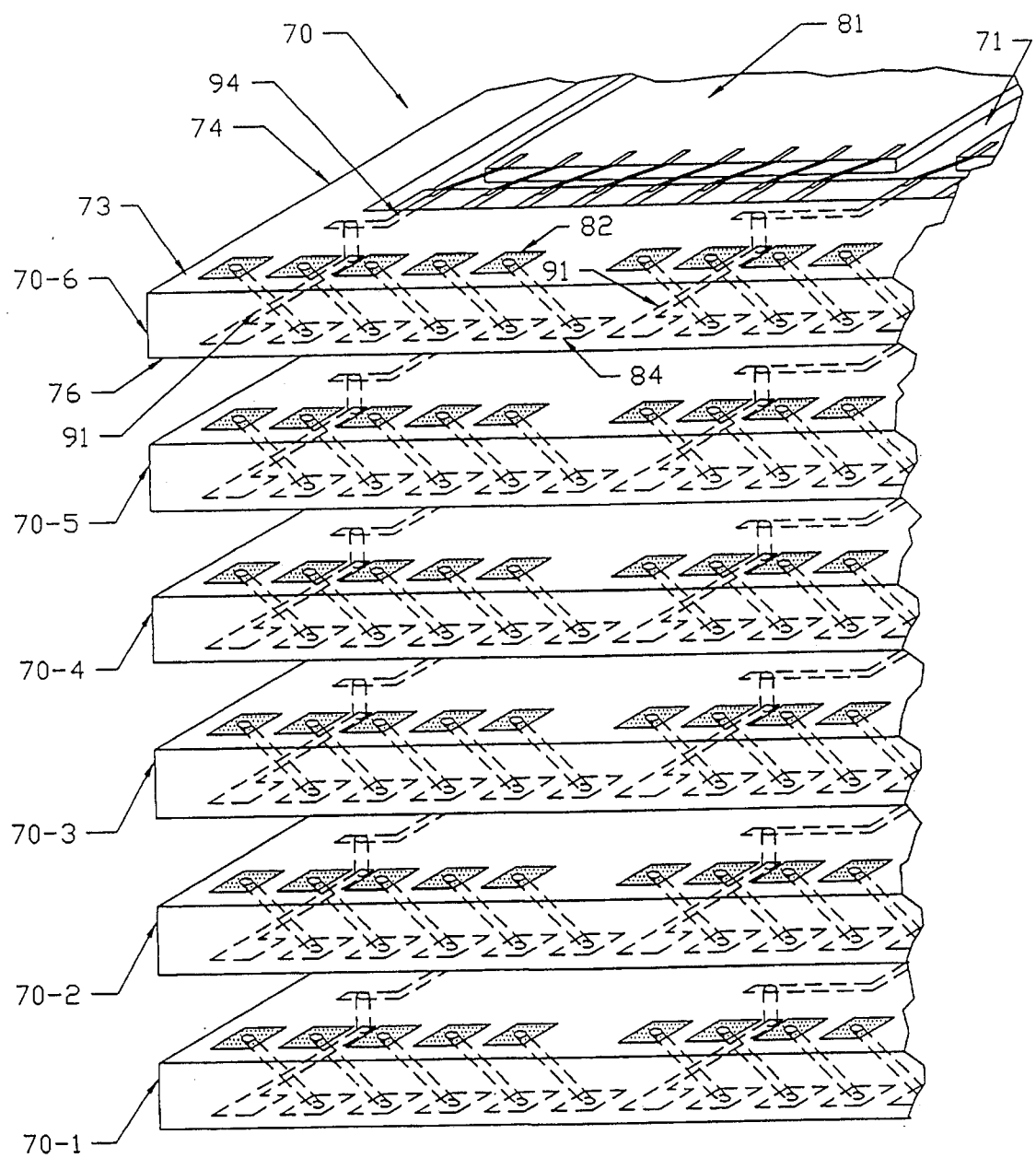
Figure 5:
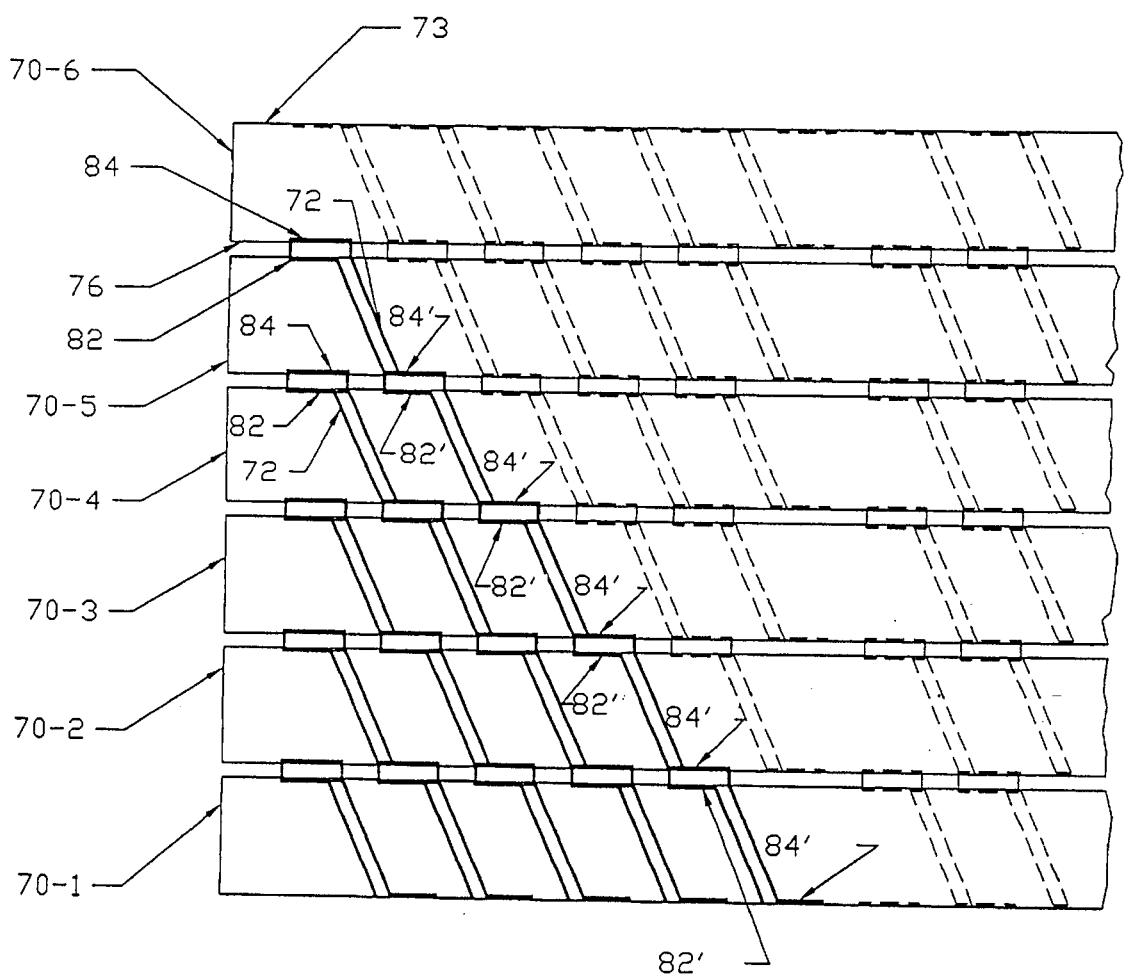

Referring now to FIGS. 3, 4 and 5, an embodiment of the tub architecture of the present invention will be described. As pointed out briefly above, rather than having to uniquely tailor the geometry of the pad extension interconnect pattern on a pad surface of each tub in dependence upon its intended location in the stack, the tub architecture of the present invention modifies the internal geometry of the vias through the tub, so that the vias are effectively angularly offset from the normal vertical path between mutually spatially aligned.

More particularly, an individual tub 70 may be formed of a laminate of a plurality of thin dielectric layers, which may be made of low temperature co-fired ceramic (LTCC) material, commonly known as 'Green Tape' (Trademark, dupont Corp.). Such material is capable of being hermetically sealed and is well suited for use in severe operating environments, such as spaceborne applications. As a non-limiting example, the typical thickness of an individual Green Tape dielectric layer may be on the order of three to four mils.

The composition of an LTCC Green Tape layer includes acrylic binders (which hold the tape together in its unfired state and provide adhesion between adjacent layers), glass and ceramic material. During the firing process the acrylic binders typically burn off at a temperature on the order of 400° C., while the glass melts at a temperature on the order of 850° C., leaving a solid glass/ceramic structure.

The configuration of an individual tub 70 is defined by a floor portion 71, upon which a semiconductor circuit chip or die 81 is mountable, and a surrounding wall portion 74, which is adjacent to and defines the perimeter of the floor portion 71. The bottom surface 76 of the bottom layer of the tub laminate forms the bottom surface of the tub 70. The chip 81 may be mechanically attached the tub floor 71 by means of a suitable layer of die attachment material, such as non-organic silver/glass die attachment material which, in addition to securing the die to the tub floor, provides a thermal flow path for removing heat from the die through the underlying tub floor. This die attachment material may have a thickness on the order of two to four mils.

A spatial arrangement of bonding pads 82 on top surface 73 of a respective tub matches a spatial arrangement of bonding pads 84 on bottom surface 76, so as to allow the pads to be readily placed in direct opposing alignment with one another when the tubs are stacked atop one another. Namely, the arrangement or spatial distribution of bonding pads 82 on the top surface 73 of the tub 71 is vertically aligned (parallel to the normal) with the spatial distribution of bonding pads 84 on the bottom surface 76 of the tub.

In accordance with the invention, the internal geometry of a respective via 72 through a respective bonding pad 82 on the upper surface 73 of the tub wall 74 is conductively connected to a respective bonding pad 84 on the lower surface 76 is such that the via, which passes through the thickness of a tub wall 74, is effectively offset at an angle 75 relative to a normal 77 to the parallel top surface 73 and the bottom surface 76 of the tub 70.

By effectively offset is meant that, as it traverses the thickness of the tub wall, the internal geometry of the via follows a path other than one perpendicular or normal to the upper and lower parallel surfaces of the tub, so that the location where a respective via intersects the upper surface 73 of the tub wall 74 is displaced laterally or not vertically aligned with the location where the via intersects the lower or bottom surface 76 of the tub wall. This angular offset may be accomplished in a number of ways depending upon the composition of the tub. Where the tub is formed of a single unitary body, the vias may be bored at an acute angle 75 offset from the normal 77 to the upper and lower surfaces, as diagrammatically shown in 3, and as shown in the simplified side view of FIG. 6.

Where the tub is formed of a plurality of laminated layers, as diagrammatically illustrated in the simplified side view of FIG. 7, which shows a tub 11 comprised of a plurality of (e.g. seven) laminated tub layers 11-1, 11-2, 11-7, the effective angular offset of the resulting top surface to bottom surface via 72 may be achieved by laterally offsetting respective individual vias 72-1, 72-2, . . . , 72-7 in each tub layer in a stepwise manner, so that when the individual layers are stacked in a laminate assembly, each individual layer via partially overlaps the individual layer via in an adjacent layer, so as to provide an offset via from the top surface 73 to the bottom surface 76, but such that the individual via in the lowermost layer (via 72-7 in lowermost layer 11-7) is laterally offset from the individual via in the uppermost layer (via 72-1 in uppermost layer 11-1).

It should also be noted that in the laminate configuration, the direction of via through an individual layer may be orthogonal to the upper and lower surfaces, as shown in FIG. 7, or it may be at an acute angle, as diagrammatically illustrated in FIGS. 8 and 9. In the embodiment of FIG. 8, the vias 72-1', 72-2' and 72-3' through layers 11-1', 11-2', and 11-3', respectively again partially overlap one another so as to provide the desired offset via 72' through the multilayer stack. In the embodiment of FIG. 9, vias 72-1", 72-2" and 72-3" through respective layers 11-1", 11-2" and 11-3", are sequentially aligned so that the resulting bore 72" has a substantially continuous interior surface or bore geometry from the top surface to the bottom surface of the laminate stack.

The offset angle 75 of a respective via 72 will depend upon the effective aspect ratio defined by the area of a bonding pad, its separation from an adjacent bonding pad on the same surface of the tub and the thickness of the tub. As noted previously, and as diagrammatically illustrated in FIGS. 4 and 5, pursuant to a preferred embodiment of the invention, for practical and efficient use of tub/pad resources, the angular offset 75 of a via 72 is such that a respective via 72 connects an upper bonding pad 82 to a lower bonding pad 84' that is immediately adjacent to a lower bonding pad 84, which is vertically aligned with the upper pad.

In addition to angularly offsetting the vias, each tub has the same pad extension layer configuration, as shown at 91, so that not only is the internal via geometry of each tub the same, but also its pad-interconnect surface geometry is the same as every other tub. Electrical connections between a chip 81 and the surrounding wall portion 74 of the tub 70 are provided by means of leads, a respective one of which is shown at 92, bonded between chip terminal pads and contact regions 94. Each contact region 94 may be coupled to a wall-embedded electrical interconnect network comprised of an interconnected arrangement of conductive vias through individual ones of the LTCC layers and printed interconnect metal on surfaces of these layers. The conductive material used for the interconnect network may be any material customarily employed for LTCC applications, such as, but not limited to, gold, silver, platinum/gold and platinum/silver.

When forming a stacked arrangement of plural ones of the multilayer LTCC tubs, a layer of mechanical bonding material, such as a glass frit, may be applied between the bottom surface 76 of one tub and the top surface 73 of the outer wall portion 74 of another tub, so that, when fired, the melted glass layer provides a secure mechanical attachment between adjacent tubs and also hermetically seals the die that have been mounted on the interior floor portions of the tubs. The topmost tub of a stack of tubs may be hermetically sealed by means of an LTCC lid, to complete the packaging assembly.

When multiple ones of the tub shown in FIG. 3 are arranged in a stack, as diagrammatically illustrated in FIGS. 4 and 5, opposing bonding pads (82, 84) of spatially aligned pad arrangements on upper and lower surfaces (73, 76) of adjacent tubs are readily joined together, and each pad extension layer 91, to which a chip interconnect lead is connected, will be interconnected through the stack of successive angularly offset bonding pads (e.g. 82–84', 84'–82'–84", . . . , 84"") to a respectively different bonding pad at the lower surface of the bottom tub 70-1 of the stack of tubs 70-1, . . . , 70-6, and thereby provide the intended external electrical access, via pads of the bottom tub 70-1, to each of the chips mounted within the stack.

Manufacture of a multi-layer laminate configuration of the LTCC tub architecture of the present invention may begin with a layout and knife-edge extraction of respective dielectric layer sections of a roll of LTCC material (Green Tape). For the tub architecture of FIGS. 3–5, three differently shaped layer sections are cut from the tape. The first has a generally solid rectangular (e.g. square) shape, corresponding to the shape of one or more bottom layers which form the floor portion of the tub. The second has a generally rectangular frame shape, with a central rectangular aperture, surrounded by a rectangular annular portion corresponding to a lip or edge portion where chip leads are connected to a pad extension interconnect segment.

A further frame layer also has a generally rectangular frame shape, with a central rectangular aperture, surrounded by a rectangular annular portion, the central aperture being sized larger than the aperture of the second layer section, so that, when placed atop the second layer section, the rectangular aperture of the third layer section will expose a portion of the rectangular annular portion of the second layer section. In an exemplary embodiment, such as shown in FIG. 3, an individual tub 70 may comprise a stack of seven LTCC layers, containing two bottom solid rectangular layers, a set of (e.g. three) middle layers, and two top layers.

After the individual layer sections have been extracted from the roll of Green Tape, orientation (alignment) holes are punched into each layer section in order to provide alignment of the respective layers on a workframe during subsequent processing. A prescribed pattern of via holes is then formed (e.g. punched) into each respective layer. The via holes include interior vertical holes associated with the interconnect from the die to the pad extension layers, and the angularly offset vias 72 of the present invention that are incorporated through the wall portion of the tub.

Once the via holes have been formed, interior via holes located in layers other than the top and bottom layers of a tub are filled with conductive material, such as silver or gold paste, as by way of a screen printing squeegee applicator. Conductive track metal (e.g. silver or gold) patterns, which serve as conductive tracks of an interconnect distribution network and the contact regions through which a chip is to be connected to the interconnect distribution network, are next printed onto the LTCC layers in accordance with the network pattern selected for the die. Any ground plane layer that may be employed is also plated at this time.

After the respective layers are electrically tested for interconnect continuity, the metallized and via-filled layers of which a tub is to be formed are arranged in a stack and the stack is placed in a lamination press. The press is then placed in a firing kiln, and the temperature is ramped to a temperature on the order of 400° C. in order to burn off the acrylic binder in the Green Tape layers. Further ramping of the temperature of the kiln to a temperature on the order of 850° C. melts the glass and solidifies the stack as a unitary structure. After this co-firing operation, the laminate assembly is removed from the press and subjected to a saw-cut operation along scribe lines.

In preparation for stacking of plural tubs into a multi-tub assembly and die attachment in each tub, respective layers of sealing glass approximately 1–2 mils thick may be is deposited onto the top surface 73 of the outer wall portion 74 and over the entirety of the bottom surface 76 of the tub, so as to insure good adhesion of the glass to ceramic/glass matrix of the LTCC tub. (To make the tub assembly space-qualifiable, a non-organic (e.g. silver/glass) die attach material should be dispensed onto the floor portion of the tub.)

A chip 81 is then set in place onto the die attachment glass. Each of the tubs that make up a stack is placed in a belt furnace to dry and fire the die attachment silver/glass material. In addition to adhering the die to the floor portion of the tub, the die attachment glass layer serves to reinforce the floor portion of the tub, so as to enhance its mechanical integrity, thereby making the tub itself and the complete tub laminate assembly more robust against shock and vibration loads.

After die attachment, interconnect leads are bonded to the terminal pads of the chip and contact regions of the interior lip or edge portion of the tub. Where the die is a memory chip, tape automated bonding (TAB) leads are utilized, so as to minimize the profile height of the leads above the die, and thereby preventing shorting of bonding wires from lead wash or accidental compression of a lead wire against another or a backside (e.g. groundplane) metallization that may be present on an adjacent overlying tub. Alternatively, low profile wedge bonding may be employed; however, TAB provides greater reliability and pre-test capability or the bare die.

Each tub is again tested to insure that the die is acceptable. For testing a memory chip-containing tub, a simple probe card may be used. The test probes should contact the TAB leads at the outer lead bond area at a contact region, in order to prevent damaging the die. Each die is preferably probed independently. Tubs with bad die are sorted from those tested as acceptable. In the case of a more complex die, such as a field programmable gate array (FPGA) die, probing of the system I/O ports, as well as the stack I/O connections is required. A field programmable gate array tub has a pad array on the bottom of the tub (not shown), which is configured to be interfaced with a 'bed-of-nails' or like test interface. A micro-probe may be used to contact the interconnect tracks exposed at the sidewall pockets in order to test I/O connections.

Upon completion of the testing operation, plural tubs are then placed on top of one another to form a stacked tub assembly. A signal processing/control circuit-containing tub may be placed at the bottom of the stack and one or more memory tubs arranged on top of the bottom tub, with a lid covering the top tub. A compression weight is then placed upon the lid in order to insure good contact between face-to-face glass layers of adjacent tubs (and the lid). The resulting fixture/assembly may then be placed in a batch oven that has the capability of controlling temperature ramp-up rate, temperature dwell time, and oven temperature for the particular size stack and the glass material being employed. As the adhesion glass layer reaches its reflow temperature, it flows between each tub. With the compression weight compressing the stack of tubs, gaps are removed in the glass interface. This reflow and joining of the glass layers provides the intended hermetic seals of each tub/tub and tub/lid interface. After sealing, lead frames are attached to the bottom of the stack, as by means of a gold/tin solder braze performed in a belt furnace and using an alignment fixture to align the leads to the stack.

As will be appreciated from the foregoing description, the drawbacks of conventional multi-chip packaging schemes, which require respectively different interconnect patterns for each tub in a stack assembly to accommodate pad-to-pad bonding of mutually aligned conductive vias, are effectively obviated in accordance with the present invention by means of a new and improved angular offset via-containing tub architecture, that allows a single type of tub architecture to be employed for each tub in a multi-stack assembly, thereby providing both interchangability and reducing costs of tub manufacture, while still providing for pad-to-pad bonding between successive tubs in a stack, so that external electrical access to each of the chips mounted within the stack of tubs may provided via pads of the bottom tub of the stack.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A packaging device for a semiconductor circuit chip comprising a tub-configured chip mounting architecture, having a floor portion sized to receive and mount thereon a semiconductor chip, and a surrounding wall portion having a top surface upon which a first arrangement of tub-to-tub bonding pads is formed and a bottom surface upon which a second arrangement of tub-to-tub bonding pads is formed, said first and second arrangements of tub-to-tub bonding pads being mutually aligned with one another along normals to said top and bottom surfaces of said tub, and an interconnect lead network which connects a terminal pad of said chip with a respective tub-to-tub bonding pad, and conductive pad-to-pad vias, which extend through said surrounding wall portion between respective ones of said first and second arrangements of tub-to-tub bonding pads at an angle offset from said normals to said top and bottom surfaces of said tub, so that when plural tubs are arranged in a stack, opposing tub-to-tub bonding pads on upper and lower surfaces of adjacent tubs are aligned with one another, interconnecting terminal pads by way of successively offset tub-to-tub bonding pads through said stack to a respectively different bonding pad at the lower surface of the bottom tub of the stack.

2. A packaging device according to claim 1, wherein said tub comprises a laminate of a plurality of dielectric layers, adjacent ones of which have stepwise sequentially partially overlapping vias.

3. A packaging device according to claim 1, wherein the angular offset of a respective via is such that said respective via connects an upper bonding pad to a lower bonding pad that is immediately adjacent to a lower bonding pad that is aligned with a normal to the upper bonding pad.

4. A packaging device according to claim 1, wherein said tub-configured chip mounting architecture further includes a pad extension layer associated with a prescribed bonding pad.

5. A packaging and interconnect assembly for a plurality of semiconductor circuit chips comprising:

a plurality of stacked tub-configured structures, each tub-configured structure including a floor portion sized to receive and mount thereon a respective semiconductor chip, and a surrounding wall portion having a top surface upon which a first arrangement of tub-to-tub bonding pads is formed and a bottom surface upon which a second arrangement of tub-to-tub bonding pads is formed, said first and second arrangements of tub-to-tub bonding pads being mutually aligned with one another along normals to said top and bottom surfaces of said tub, and an interconnect lead network which connects a terminal pad of said respective chip with a respective tub-to-tub bonding pad, and conductive pad-to-pad vias, which extend through said surrounding wall portion between respective ones of said first and second arrangements of tub-to-tub bonding pads at an angle offset from said normals to said top and bottom surfaces of said tub, so that via paths are provided through said plurality of stacked tub-configured structures at an angle relative to said normals, so that when plural tubs are arranged in a stack, opposing tub-to-tub bonding pads on upper and lower surfaces of adjacent tubs are aligned with one another, interconnecting terminal pads by way of successively offset tub-to-tub bonding pads through said stack to a respectively different bonding pad at the lower surface of the bottom tub of said stack.

6. A packaging and interconnect assembly according to claim 5, wherein a respective tub comprises a laminate of a plurality of dielectric layers, adjacent ones of which have stepwise sequentially partially overlapping vias.

7. A packaging device according to claim 5, wherein the angular offset of a respective via is such that said respective via connects an upper bonding pad to a lower bonding pad that is immediately adjacent to a lower bonding pad that is aligned with a normal to the upper bonding pad.

8. A packaging device according to claim 5, wherein each tub-configured chip mounting architecture has an identically configured pad extension layer associated with the same prescribed bonding pad.

9. A packaging device for a semiconductor circuit chip comprising a chip support substrate, having a first portion sized to receive and mount thereon a semiconductor circuit chip, and a second portion adjacent to said first portion and having a top surface upon which a first arrangement of bonding pads is formed and a bottom surface, parallel to said first surface and upon which a second arrangement of bonding pads is formed, said first and second arrangements of bonding pads being mutually aligned with one another along normals to said top and bottom surfaces, and an interconnect lead network which connects a terminal pad of said semiconductor circuit chip with a respective bonding pad, and conductive pad-to-pad vias, which extend through said second portion of said chip support substrate between respective ones of said first and second arrangements of bonding pads at an orientation that is offset from said normals to said top and bottom surfaces of said chip support substrate, so that when plural chip support substrates are arranged in a stack, opposing bonding pads on upper and lower surfaces of adjacent chip support substrates are aligned with one another, interconnecting terminal pads by way of successively offset bonding pads through said stack to a respectively different bonding pad at the lower surface of the bottom chip support substrate of said stack.

10. A packaging device according to claim 9, wherein said chip support substrate further includes a pad extension layer integrally connected with a bonding pad.

11. A packaging device according to claim 9, wherein the offset orientation of a respective via is such that said respective via connects a first bonding pad on said top surface of said chip support substrate to a second bonding pad on said bottom surface of said chip support substrate, which second bonding pad is immediately adjacent to a third bonding pad on said bottom surface of said chip support substrate that is aligned with a normal to said first bonding pad.

12. A packaging device according to claim 11, wherein said respective via extends from said first bonding pad on said top surface of said chip support substrate through said chip support substrate, at an angular offset relative to a normal to said first surface, to said second bonding pad on said bottom surface of said chip support substrate.

13. A packaging device according to claim 12, wherein said chip support substrate further includes a pad extension layer integrally connected with a bonding pad.

14. A packaging device according to claim 13, wherein said chip support substrate comprises a tub-configured chip support structure having a floor portion sized to receive said semiconductor circuit chip and a surrounding wall portion having a top surface upon which a first arrangement of upper bonding pads is formed, and bottom surface upon which a second arrangement of lower bonding pads is formed.

15. A packaging device according to claim 14, wherein said tub-configured chip support structure is comprised of a laminate of a plurality of dielectric layers, adjacent ones of which have stepwise sequentially partially overlapping vias.

16. A packaging and interconnect assembly for a plurality of semiconductor circuit chips comprising:

a plurality of stacked chip-support structures, each chip-support structure including a first portion sized to receive and mount thereon a respective semiconductor circuit chip, and an adjacent second portion having a top surface upon which a first arrangement of first bonding pads is formed and a bottom surface parallel to said first surface and upon which a second arrangement of second bonding pads is formed, said first and second arrangements of first and second bonding pads being mutually aligned with one another along normals to said top and bottom surfaces of said chip-support structure, and an interconnect lead network which connects a terminal pad of said respective circuit chip with a bonding pad, and conductive bonding pad-to-bonding pad vias, which extend through said second portion of said chip-support substrate between respective ones of said first and second arrangements of first and second bonding pads at an orientation offset from said normals to said top and bottom surfaces of said chip-support substrate, so that conductive via paths are provided through said plurality of stacked chip-support structures at orientations offset relative to said normals, so that when plural chip-support substrates are arranged in a stack, opposing bonding pads on upper and lower surfaces of adjacent chip-support substrates are aligned with one another, interconnecting terminal pads by way of successively offset bonding pads through said stack to a respectively different bonding pad at the lower surface of the bottom chip-support substrate of said stack.

17. A packaging and interconnect assembly according to claim 16, wherein each chip support substrate further includes a commonly configured pad extension layer integrally connected with the same bonding pad.

18. A packaging and interconnect assembly according to claim 16, wherein the offset orientation of a respective conductive bonding pad-to-bonding pad via is such that said respective conductive bonding pad-to-bonding via connects a first bonding pad on said top surface of said chip support substrate to a second bonding pad on said bottom surface of said chip support substrate, which second bonding pad is immediately adjacent to a third bonding pad on said bottom surface of said chip support substrate that is aligned with a normal to said first bonding pad.

19. A packaging and interconnect assembly according to claim 18, wherein said respective bonding pad-to-bonding pad via extends from said first bonding pad on said top surface of said chip support substrate through said chip support substrate, at an angular offset relative to a normal to said first surface, to said second bonding pad on said bottom surface of said chip support substrate.

20. A packaging and interconnect assembly according to claim 19, wherein chip support substrate has an identically configured pad extension layer associated with the same bonding pad.

21. A packaging and interconnect assembly according to claim 20, wherein each chip support substrate comprises a tub-configured chip support structure having a floor portion sized to receive a semiconductor circuit chip and a surrounding wall portion having a top surface upon which a first arrangement of upper bonding pads is formed, and bottom surface upon which a second arrangement of lower bonding pads is formed.

22. A packaging device according to claim 16, wherein said tub-configured chip support structure is comprised of a laminate of a plurality of dielectric layers, adjacent ones of which have stepwise sequentially partially overlapping vias.

* * * * *